United States Patent
Sun et al.

(10) Patent No.: US 8,564,104 B2
(45) Date of Patent: Oct. 22, 2013

(54) PASSIVATION LAYER STRUCTURE OF SEMICONDUCTOR DEVICE AND METHOD FOR FORMING THE SAME

(75) Inventors: Wen-Ching Sun, Taoyuan County (TW); Tzer-Shen Lin, Hsinchu (TW); Sheng-Min Yu, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/084,486

(22) Filed: Apr. 11, 2011

(65) Prior Publication Data

US 2012/0104566 A1 May 3, 2012

(30) Foreign Application Priority Data

Oct. 29, 2010 (TW) ................. 99137154 A

(51) Int. Cl.
*H01L 23/58* (2006.01)
*H01L 21/31* (2006.01)

(52) U.S. Cl.
USPC ............. 257/632; 257/E23.002; 257/E21.24; 438/784

(58) Field of Classification Search
USPC ............... 257/506, 632, E23.002, E21.24
See application file for complete search history.

(56) References Cited

U.S. PATENT DOCUMENTS 5,700,383 A * 12/1997 Feller et al. ............ 438/645
2003/0169968 A1* 9/2003 Bazylenko et al. ......... 385/43

OTHER PUBLICATIONS

D. Konig et al., "Field Effect of Fixed Negative Charges on Oxidized Silicon Induced by $AlF_3$ Layers with Fluorine Deficiency," Applied Surface Science, Jul. 2004, pp. 222-227, vol. 234, Elsevier, US.

Juho Song et al., "High Quality Fluorinated Silicon Oxide Films Prepared by Plasma Enhanced Chemical Vapor Deposition at 120 ° C," Applied Physics Letters, pp. 1876-1878, Sep. 1996, vol. 69, Issue 13, American Institute of Physics, US.

Sung Woo Kim et al., "Characteristics of $Al_2O_3$ Gate Dielectrics Partially Fluorinated by a Low Energy Fluorine Beam," Applied Physics Letters, Nov. 2008, 3 pages, vol. 93, American Institute of Physics, US.

M. Aguilar-Frutis et al., A Study of the Dielectric Characteristics of Aluminum Oxide Thin Films Deposited by Spray Pyrolysis from $Al(acac)_3$, Thin Solid Films, May 2001, pp. 200-206, vol. 389, Elsevier, US.

B. Hoex et al., "Ultralow Surface Recombination of $c$-Si Substrated Passivated by Plasma-Assisted Atomic Layer Deposited $Al_2O_3$," Applied Physics Letters, Jul. 2006, 3 pp., vol. 89, American Institute of Physics, US.

* cited by examiner

*Primary Examiner* — Matthew W Such
*Assistant Examiner* — Monica D Harrison

(57) ABSTRACT

According to an embodiment of the invention, a passivation layer structure of a semiconductor device disposed on a semiconductor substrate is provided, which includes a passivation layer structure disposed on the semiconductor substrate, wherein the passivation layer structure includes a halogen-doped aluminum oxide layer. According to an embodiment of the invention, a method for forming a passivation structure of a semiconductor device is provided.

13 Claims, 2 Drawing Sheets

PASSIVATION LAYER STRUCTURE OF SEMICONDUCTOR DEVICE AND METHOD FOR FORMING THE SAME

CROSS REFERENCE TO RELATED APPLICATIONS

This application claims priority of Taiwan Patent Application No. 099137154, filed on Oct. 29, 2010, the entirety of which is incorporated by reference herein.

BACKGROUND

1. Technical Field

The present invention relates to a semiconductor device, and in particular relates to a semiconductor device having a passivation layer.

2. Related Art

Due to the gradual depletion of conventional fossil fuels and the environmental impact caused by using fossil fuels, development of alternative energy sources with low pollution and high electrical efficiency is becoming more and more important.

Among the variety of developed new energy sources, solar cells are capable of transforming free and non-exhausted sunlight into electrical energy for use. Different from thermal electric power from fossil fuel which needs a plurality of energy transformation steps, solar cells are capable of directly transforming light into electrical energy, providing high electrical efficiency. In addition, no pollutant such as carbon dioxide or carbon oxide is generated during the operation of solar cells.

The operation principle of solar cells uses photon from light to activate the formation of electron-hole pairs in a semiconductor and directs the electrons out through a conducting route for use. However, the electron-hole pairs may be recombined before being directed out such that the electrical efficiency is reduced.

Therefore, in order to further improve the electrical efficiency of solar cells, being able to prevent the recombination between electrons and holes before electrons are directed out is getting more important.

SUMMARY

According to an embodiment of the invention, a passivation layer structure of a semiconductor device disposed on a semiconductor substrate is provided, which includes a passivation layer structure disposed on the semiconductor substrate, wherein the passivation layer structure includes a halogen-doped aluminum oxide layer.

According to an embodiment of the invention, a method for forming the passivation layer structure of a semiconductor device mentioned above is provided, wherein the semiconductor substrate is a p-type semiconductor layer and the formation step of forming the halogen-doped aluminum oxide layer, which comprises: applying a solution on a surface of the p-type semiconductor layer, wherein the solution comprises an aluminum-containing compound solution and a halogen-containing compound solution; and heating the p-type semiconductor layer to a temperature such that the solution transforms into the halogen-doped aluminum oxide layer.

A detailed description is given in the following embodiments with reference to the accompanying drawings.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION

The following description is an embodiment of carrying out the invention. This description is made for the general principles of the invention and should not be taken in a limiting sense.

It is understood, that the following disclosure provides many difference embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," or "overlying," (and like descriptions) a second layer include embodiments where the first and second layers are in direct contact and those where one or more layers are interposing the first and second layers.

Figure 1:
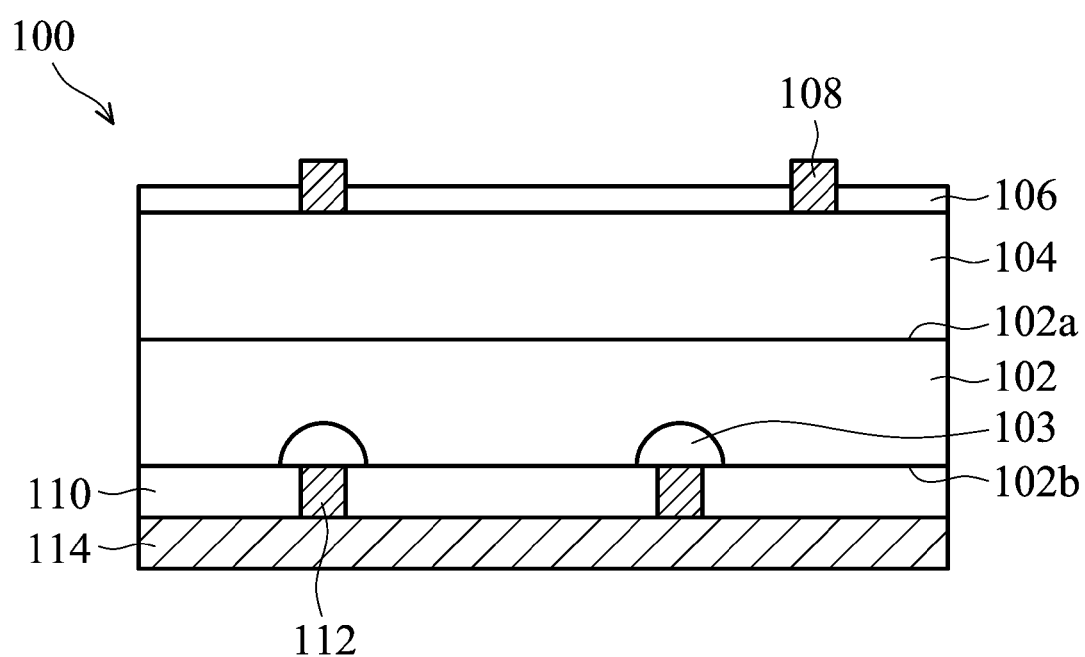
FIG. 1 is a cross-sectional view showing a semiconductor device according to an embodiment of the present invention.

FIG. 1 is a cross-sectional view showing a semiconductor device 100 according to an embodiment of the present invention. Hereafter, the fabrication method and the structure of the semiconductor device 100 of an embodiment will be illustrated with reference made to FIG. 1. The semiconductor device 100 of an embodiment of the present invention may include a variety of electronic products, wherein the semiconductor device 100 may include, for example, a semiconductor device applied to a solar cell. In the following description, a semiconductor device applied to a solar cell as an example will be illustrated. However, it should be appreciated that embodiments of the present invention are not limited to be a semiconductor device applied to a solar cell.

As shown in FIG. 1, a semiconductor substrate is provided, which includes, for example, a p-type semiconductor layer 102 and a second type semiconductor layer such as an n-type semiconductor layer 104. The n-type semiconductor layer 104 is formed on a surface 102a of the p-type semiconductor layer 102. In one embodiment, a semiconductor substrate such as a silicon substrate is provided. The silicon substrate may be doped with a p-type dopant or an n-type dopant. If the silicon substrate is an n-type substrate, a p-type dopant may be implanted into the n-type substrate through an ion implantation process to transform a portion of the n-type substrate into a p-type semiconductor layer. Thus, the surface 102a of the p-type semiconductor layer may serve as a PN junction between the p-type semiconductor layer 102 and the n-type semiconductor layer 104. Similarly, if the silicon substrate is a p-type substrate, an n-type dopant may be implanted into the p-type substrate through an ion implantation process to transform a portion of the p-type substrate into an n-type semiconductor layer.

A passivation layer structure is formed on a surface 102b of the p-type semiconductor layer 102, which includes a halogen doped aluminum oxide layer 110. The halogen doped aluminum oxide layer 110 includes an aluminum oxide layer and at least a halogen dopant doped therein. For example, the halogen doped aluminum oxide layer 110 may include, but is not limited to, a fluorine doped aluminum oxide layer, chlorine doped aluminum oxide layer, or combinations thereof. In another embodiment, the halogen doped aluminum oxide layer 110 may include other halogen elements such as bromine or iodine. In one embodiment, a thickness of the halogen doped aluminum oxide layer may be between about 5 nm and about 200 nm.

Because the halogen doped aluminum oxide layer 110 has negative fixed charges, a built-in electric field may be generated. When electron-hole pairs are generated due to light irradiation, the negative fixed charges help to attract the holes and distract the electrons away. Thus, the probability of recombination of electrons and holes is reduced such that carrier lifetime is prolonged. Therefore, electrons may be led out (through, for example, an electrode to be formed in the following process) successfully for use.

In the solar cell technique, the fabrication cost is usually very high such that the solar cell is not commonly used. In one embodiment of the invention, the halogen doped aluminum oxide layer 110 in the semiconductor device 100 is formed by applying a solution. Thus, fabrication cost may be significantly reduced. For example, in one embodiment, the halogen doped aluminum oxide layer 110 is formed by spray coating. In another embodiment, the halogen doped aluminum oxide layer 110 is formed by spin coating. Compared with growing the halogen doped aluminum oxide layer 110 by vapor deposition (such as, plasma enhanced chemical vapor deposition, atomic layer deposition, or chemical vapor deposition), embodiments of the invention which adopt solution application may significantly reduce fabrication cost and fabrication time, benefiting the popularization of solar cell.

In one embodiment, the formation step of the halogen doped aluminum oxide layer 110 includes applying a solution on the surface 102b of the p-type semiconductor layer 102. The applied solution includes an aluminum-containing compound solution and a halogen-containing compound solution. The p-type semiconductor layer 102 is then heated to a suitable temperature such that the applied solution is transformed into the halogen doped aluminum oxide layer 110. The aluminum-containing compound solution in the solution may include, for example, (but is not limited to) aluminum acetylacetonate, aluminum chloride, aluminum nitrate, trimethyl aluminum, or combinations thereof. The halogen-containing compound solution in the solution may include, for example, (but is not limited to) ammonium fluoride, hydrofluoric acid, ammonium chloride, hydrochloric acid, ammonium bromide, hydrobromic acid, or combinations thereof. In one embodiment, a percentage between the mole value of the aluminum compound in the aluminum-containing compound solution and the mole value of the halogen compound in the halogen-containing compound solution is between, for example, 1:0.2 and 1:5. The solution may include a solubilizing agent and/or a solvent such as alcohol, water, acid, or combinations thereof. Typically, after the aluminum-containing compound solution, the halogen-containing compound solution, and the solvent/solubilizing agent are substantially mixed, the solution mentioned above may be applied onto the surface 102b of the p-type semiconductor layer 102 by spray coating, ultrasonic spray coating, or spin coating.

In one embodiment, the substrate including the n-type semiconductor layer 104 and the p-type semiconductor layer 102 may be disposed on a carrier substrate, wherein a temperature of the carrier substrate can be elevated. Then, the solution including the aluminum-containing compound solution and the halogen-containing compound solution is spray coated or spin coated on the surface 102b of the p-type semiconductor layer 102. In the case that the spray coating process is adopted, the carrier substrate may simultaneously elevate the temperature of the n-type semiconductor layer 104 and the p-type semiconductor layer 102 disposed thereon during the step of spray coating the solution. In one embodiment, the p-type semiconductor layer 102 may be heated to be, for example, about 100° C. and about 500° C. It should be appreciated that the heating temperature may be adjusted according to the situation. The temperature needs to be high enough to remove the organic compound portion such that the halogen doped aluminum oxide layer 110 will remain. However, the temperature should not be too high such that too much defects are generated or halogen elements with small volume are removed. In one embodiment, the solution including the aluminum-containing compound solution and the halogen-containing compound solution is spray coated on the surface 102b of the p-type semiconductor layer 102 by ultrasonic spray coating. The vibration of ultrasonic waves helps to make the formed halogen doped aluminum oxide layer 110 denser.

In addition, in the case that a spin coating process is adopted, the solution including the aluminum-containing compound solution and the halogen-containing compound solution may be spin coated on the surface 102b of the p-type semiconductor layer 102 to form a film. Subsequently, the p-type semiconductor layer 102 is heated such that the formed film becomes the halogen doped aluminum oxide layer 110.

In one embodiment, the doping concentration of halogen in the halogen doped aluminum oxide layer 110 is between about 0.01% and about 5%. Note that in one embodiment, from the XPS spectrum, it is discovered that the fluorine atoms are located at interstitial sites in the halogen doped aluminum oxide layer 110. However, it should be appreciated that embodiments of the invention are not limited thereto. In another embodiment, the fluorine atoms or other halogen atoms may be located at substitutional sites in the halogen doped aluminum oxide layer 110.

Still referring to FIG. 1, an electrode 112 electrically connected to the p-type semiconductor layer 102 and an electrode 108 electrically connected to the n-type semiconductor layer 104 are then formed. For example, the formed halogen doped aluminum oxide layer 110 may be patterned to expose a portion of the p-type semiconductor layer 102. Then, the electrode 112 is formed on the exposed p-type semiconductor layer 102. A conducting layer 114 may further be formed on the halogen doped aluminum oxide layer 110 and the electrode 112. The materials and formation methods of the electrode 112 or the conducting layer 114 may be known by one skilled in the art and additional descriptions are not repeated herein. In one embodiment, a p-type heavily doped region 103 may have previously been formed on the location, where the p-type semiconductor layer 102 will be formed, to increase the conductivity, benefiting the carrier generated by the photoelectric effect to be directed out for use.

Note that a material layer 106 may be optionally formed on the n-type semiconductor layer 104. The material layer 106 may include, for example, a passivation layer or an antireflective layer. The electrode 108 may be formed on the exposed n-type semiconductor layer 104.

Figure 2A:
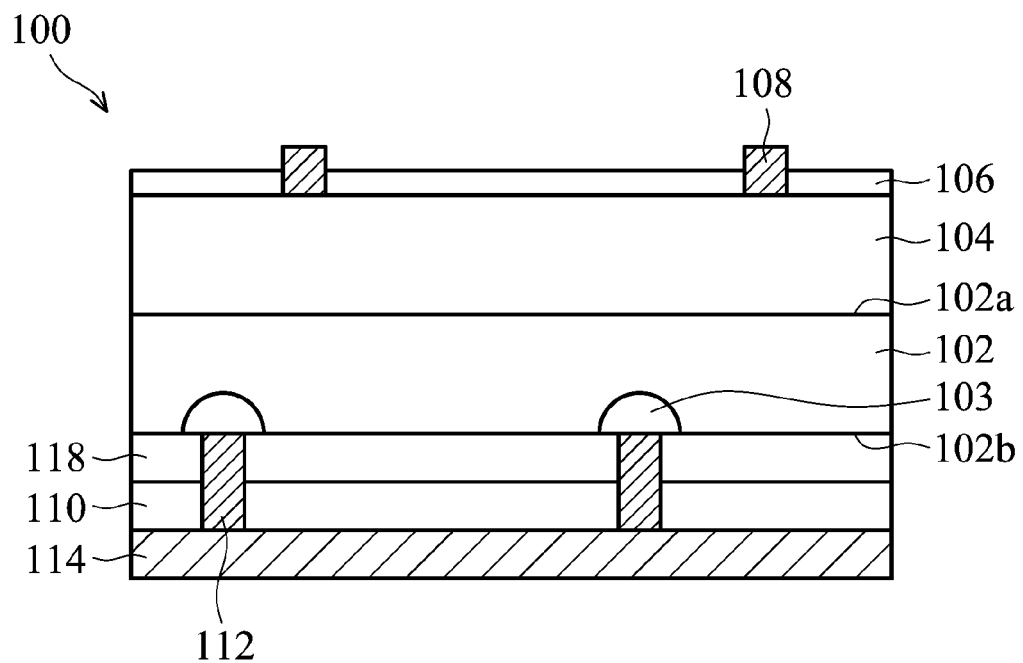
FIG. 2A is a cross-sectional view showing a semiconductor device according to an embodiment of the present invention.

FIG. 2A is a cross-sectional view showing a semiconductor device 100 according to an embodiment of the present invention. Thereafter, a semiconductor device 100 of an embodiment of the invention is illustrated with reference made to FIG. 2A, wherein same or similar reference numbers are used to designate same or similar elements.

The embodiment shown in FIG. 2A is similar to the embodiment shown in FIG. 1. The main difference therebetween is that for the embodiment shown in FIG. 2A, a passivation layer 118 is formed between the surface 102b of the p-type semiconductor layer 102 and the halogen doped aluminum oxide layer 110. The passivation layer 118 may be, for example, (but is not limited to) an oxide layer. In one embodiment, the passivation layer 118 directly contacts with the halogen doped aluminum oxide layer 110. In one embodiment, the passivation layer 118 directly contacts with the p-type semiconductor layer 102. In one embodiment, before the halogen doped aluminum oxide layer 110 is formed, the passivation layer 118 is formed on the surface 102b of the p-type semiconductor layer 102. Then, the halogen doped aluminum oxide layer 110 is directly formed on the passivation layer 118. The formation method for the passivation layer 118 may include a chemical vapor deposition process, thermal oxidation process, oxidation process, or coating process.

In one embodiment, the formation step of the passivation layer 118 includes performing an oxidation process to the surface 102b of the p-type semiconductor layer 102 to oxidize a portion of the p-type semiconductor layer 102 to be the passivation layer 118. A suitable oxidation process may include a thermal oxidation process or applying an oxidant on the surface 102b of the p-type semiconductor layer 102. In one embodiment, the p-type semiconductor layer 102 is a silicon substrate including p-type dopants. Thus, the formed passivation layer 118 may be a silicon oxide layer including the p-type dopants. In one embodiment, the p-type semiconductor layer 102 is disposed in the air such that the passivation layer 118 is naturally formed on the surface 102b due to the oxidation of the p-type semiconductor layer 102. In this case, the passivation layer 118 is an oxide layer of a semiconductor substrate (i.e., the p-type semiconductor layer 102), wherein a thickness of the passivation layer 118 may be, for example, less than about 5 nm.

In another embodiment, the p-type semiconductor layer 102 may be dipped into a nitric acid solution such that the portion of the p-type semiconductor layer 102 near the surface 102b is oxidized to be an oxide layer (i.e., the passivation layer 118). In one embodiment, a temperature of the nitric acid solution may be controlled to be between about 10° C. and about 120° C. In one embodiment, the dipping time of the p-type semiconductor layer 102 in the nitric acid solution may be about 3 minutes and about 20 minutes.

If the passivation layer 118 is disposed between the p-type semiconductor layer 102 and the halogen doped aluminum oxide layer 110, the amount of defect generated during the heating process of the halogen doped aluminum oxide layer 110 may be reduced. The passivation layer 118 is preferable an oxide layer of the p-type semiconductor layer 102 and thus has a structure similar to that of the p-type semiconductor layer 102. Thus, the occurrence of defect is reduced such that the probability of the recombination between electron and hole is accordingly reduced. In one embodiment, a portion of the halogen atoms and/or ions in the halogen doped aluminum oxide layer 110 may be diffused into the passivation layer 118.

Figure 2B:
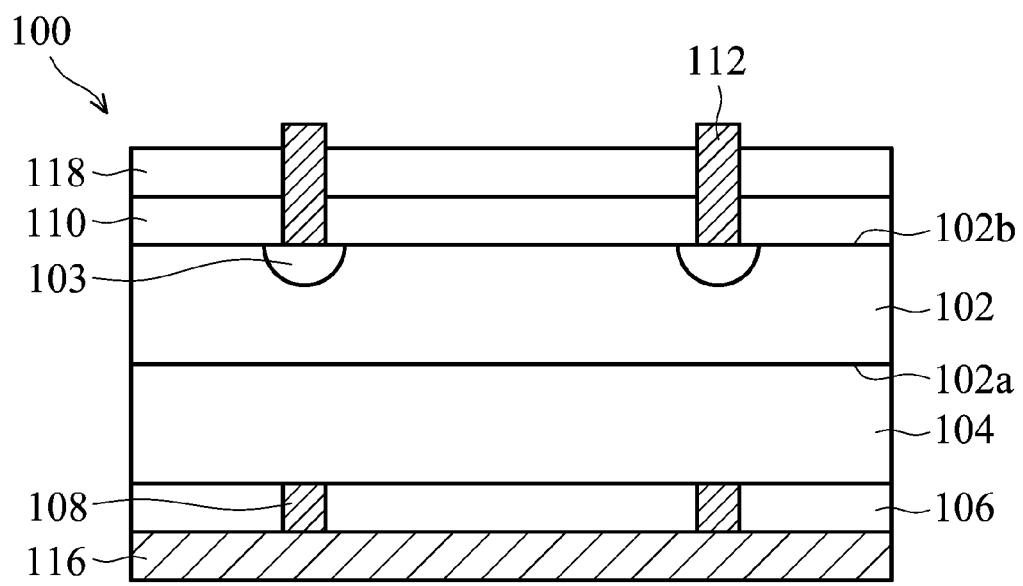
FIG. 2B is a cross-sectional view showing a semiconductor device according to an embodiment of the present invention.

FIG. 2B is a cross-sectional view showing a semiconductor device 100 according to an embodiment of the present invention. Hereafter, the fabrication method and the structure of the semiconductor device 100 is illustrated with reference made to FIG. 2B, wherein same or similar reference numbers are used to designate same or similar elements.

The embodiment shown in FIG. 2B is similar to the embodiment shown in FIG. 2A. The main difference therebetween is that in the embodiment shown in FIG. 2B, the surface 102b of the p-type semiconductor layer 102 is used as the surface for receiving light. In this case, in order to make light (such as sunlight) successfully enter the solar cell to generate the photoelectric effect, the conducting layer 114 is not formed such that the p-type semiconductor layer 102 is exposed. In addition, a conducting layer 116 may be optionally formed on the n-type semiconductor device 104 to help with the collection of the photoelectric current.

Thereafter, a plurality of examples are provided to further illustrate embodiments of the invention.

Example 1

A p-type wafer is provided. After the wafer is cleaned, the p-type wafer is dipped in a nitric acid solution which has a concentration of 69% for 15 minutes to form a silicon oxide layer on the surface of the p-type wafer.

After the wafer is cleaned and dried, a precursor solution used for spray coating a halogen doped aluminum oxide layer on the silicon oxide layer is prepared. The method for forming the precursor solution is provided in the flowing description.

13 g of aluminum acetylacetonate and 1.5 g of ammonium fluoride are put into a solvent including 100 g of methanol, 300 g of water, and 30 g of acetic acid and stirred to form a solution including an aluminum-containing compound solution and a halogen-containing compound solution.

Then, the cleaned wafer is disposed on a substrate which is capable of heating the wafer. The temperature of the wafer is then elevated to be 350° C.

Then, an ultrasonic wave is applied to the solution including the aluminum-containing compound solution and the halogen-containing compound solution to generate vapor of the solution. Then, the vapor of the solution is carried by an air flow of 10 L/minute and spray coated on an upper surface of the silicon oxide layer on the wafer to form a fluorine doped aluminum oxide layer, wherein the spray coating time is 30 minutes. After opposite sides of the wafer are spray coated, the wafer is measured to identify the carrier lifetime.

Example 2

A p-type wafer is provided. After the wafer is cleaned, the p-type wafer is dipped in a nitric acid solution which has a concentration of 69% for 15 minutes to form a silicon oxide layer on the surface of the p-type wafer.

After the wafer is cleaned and dried, a precursor solution used for spray coating a halogen doped aluminum oxide layer on the silicon oxide layer is prepared. The method for forming the precursor solution is provided in the flowing description.

13 g of aluminum acetylacetonate and 5.3 g of ammonium fluoride are put into a solvent including 100 g of methanol, 300 g of water, and 30 g of acetic acid and stirred to form a solution including an aluminum-containing compound solution and a halogen-containing compound solution.

Then, the cleaned wafer is disposed on a substrate which is capable of heating the wafer. The temperature of the wafer is then elevated to be 350° C.

Then, an ultrasonic wave is applied to the solution including the aluminum-containing compound solution and the halogen-containing compound solution to generate vapor of the solution. Then, the vapor of the solution is carried by an air flow of 10 L/minute and spray coated on an upper surface of the silicon oxide layer on the wafer to form a fluorine doped aluminum oxide layer, wherein the spray coating time is 30 minutes. After opposite sides of the wafer are spray coated, the wafer is measured to identify the carrier lifetime.

Comparative Example 1

The preparation method of the Comparative example 1 is substantially the same as that of the Example 1 and 2. The main difference is that no halogen doped aluminum oxide layer is formed in the Comparative example 1. Only an aluminum oxide layer is spray coated onto a wafer. That is, no ammonium fluoride or aluminum acetylacetonate is added in the solution for spray coating.

Comparative Example 2

The preparation method of the Comparative example 2 is substantially the same as that of the Example 1 and 2. The main difference is that no halogen doped aluminum oxide layer is formed in the Comparative example 2. Only an aluminum oxide layer is formed on the passivation layer by an atomic deposition process. After opposite sides of the wafer are coated by the aluminum oxide layer, the wafer is annealed at a nitrogen atmosphere for 30 minutes.

Then, the wafers of the Example 1, the Example 2, the Comparative example 1, and the Comparative example 2 are measured to identify their carrier lifetimes, respectively. The results are listed in Table 1.

TABLE 1

|  | Carrier Lifetime (μs) |
| --- | --- |
| Example 1 | 101 |
| Example 2 | 67 |
| Comparative Example 1 | 36 |
| Comparative Example 2 | 103 |

As shown in Table 1, the carrier lifetimes of the Example 1 and the Example 2 are significantly higher than that of the Comparative example 1. It is possible that because the embodiments of the invention include the halogen doped aluminum oxide layer, negative fixed charges of the aluminum oxide layer is increased and the field passivation ability of the aluminum oxide is improved, thus increasing the carrier lifetime. In addition, the carrier lifetimes of the Example 1 and the Example 2 are both close to that of the Comparative example 2. Thus, the halogen doped aluminum oxide layer of embodiments of the invention and the aluminum oxide layer formed by atomic deposition process have similar passivation ability. Note that the halogen doped aluminum oxide layer of embodiments of the invention is formed in a low temperature. A heat treatment is not required after the aluminum oxide layer is formed. Fabrication time is significantly reduced. No vacuum equipment is required, thus significantly reducing fabrication costs.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A passivation layer structure of a semiconductor device disposed on a semiconductor substrate, comprising:
    a passivation layer structure disposed on the semiconductor substrate, wherein the passivation layer structure comprises a halogen-doped aluminum oxide layer including an aluminum oxide layer and at least a halogen dopant doped therein; and
    an oxide layer of the semiconductor substrate disposed between the semiconductor substrate and the halogen-doped aluminum oxide layer, wherein a thickness of the oxide layer of the semiconductor substrate is less than 5 nm.

2. The passivation layer structure of a semiconductor device disposed on a semiconductor substrate as claimed in claim 1, wherein the semiconductor substrate is a p-type semiconductor layer, and a material of the p-type semiconductor layer comprises silicon, germanium, or gallium arsenide.

3. The passivation layer structure of a semiconductor device disposed on a semiconductor substrate as claimed in claim 1, wherein a halogen in the halogen-doped aluminum oxide layer comprises fluorine, chlorine, bromine, or iodine.

4. The passivation layer structure of a semiconductor device disposed on a semiconductor substrate as claimed in claim 1, wherein a thickness of the halogen-doped aluminum oxide layer is between 5 nm and 200 nm.

5. The passivation layer structure of a semiconductor device disposed on a semiconductor substrate as claimed in claim 1, wherein a doping concentration of halogen in the halogen-doped aluminum oxide layer is between about 0.01% and about 5%.

6. A method for forming a passivation layer structure of a semiconductor device disposed on a semiconductor substrate comprising a passivation layer structure disposed on the semiconductor substrate, wherein the passivation layer structure comprises a halogen-doped aluminum oxide layer, wherein the semiconductor substrate is a p-type semiconductor layer and the formation step of forming the halogen-doped aluminum oxide layer comprises:
    applying a solution on a surface of the p-type semiconductor layer, wherein the solution comprises an aluminum-containing compound solution and a halogen-containing compound solution; and
    heating the p-type semiconductor layer to a temperature such that the solution transforms into the halogen-doped aluminum oxide layer.

7. The method for forming the passivation layer structure of a semiconductor device as claimed in claim 6, wherein the aluminum-containing compound solution comprises aluminum acetylacetonate, aluminum chloride, aluminum nitrate, trimethyl aluminum, or combinations thereof.

8. The method for forming the passivation layer structure of a semiconductor device as claimed in claim 6, wherein the halogen-containing compound solution comprises ammonium fluoride, hydrofluoric acid, ammonium chloride, hydrochloric acid, ammonium bromide, hydrobromic acid, or combinations thereof.

9. The method for forming the passivation layer structure of a semiconductor device as claimed in claim 6, wherein the step of applying the solution comprises using a spray coating process or a spin coating process.

10. The method for forming the passivation layer structure of a semiconductor device as claimed in claim 6, wherein the temperature is between about 100° C. and 500° C.

11. The method for forming the passivation layer structure of a semiconductor device as claimed in claim 6, wherein prior to the step of applying the aluminum-containing compound solution, the method further comprises dipping the p-type semiconductor layer into a nitric acid solution to form an oxide layer of the p-type semiconductor layer.

12. The method for forming the passivation layer structure of a semiconductor device as claimed in claim 11, wherein a temperature of the nitric acid solution is between 10° C. and 120° C.

13. The method for forming the passivation layer structure of a semiconductor device as claimed in claim 11, wherein the p-type semiconductor layer is dipped into the nitric acid solution for 3 minutes to 20 minutes.

* * * * *